United States Patent
Conway

(10) Patent No.: US 10,470,281 B2
(45) Date of Patent: Nov. 5, 2019

(54) 24 HOUR PROGRAMMABLE TIMER CUSTOM INTEGRATED CIRCUITS

(71) Applicant: Joseph Charles Conway, Rancho Santa Fe, CA (US)

(72) Inventor: Joseph Charles Conway, Rancho Santa Fe, CA (US)

( * ) Notice: Subject to any disclaimer, the term of this patent is extended or adjusted under 35 U.S.C. 154(b) by 152 days.

(21) Appl. No.: 15/699,388

(22) Filed: Sep. 8, 2017

(65) Prior Publication Data

US 2019/0082522 A1 Mar. 14, 2019

(51) Int. Cl.
| | |
|---|---|
| G04G 15/00 | (2006.01) |
| G06F 1/3203 | (2019.01) |
| H05B 37/02 | (2006.01) |
| H03K 17/296 | (2006.01) |
| G04C 23/18 | (2006.01) |

(52) U.S. Cl.
CPC ......... *H05B 37/0281* (2013.01); *G04C 23/18* (2013.01); *G04G 15/006* (2013.01); *H03K 17/296* (2013.01); *G06F 1/3203* (2013.01)

(58) Field of Classification Search
CPC ...... G06F 1/3203; G06F 1/324; G06F 1/3296; H05B 37/0281
See application file for complete search history.

(56) References Cited

U.S. PATENT DOCUMENTS

| | | | | |
|---|---|---|---|---|
| 4,967,098 A | * | 10/1990 | Carroll | G04G 15/003 307/140 |
| 5,488,376 A | * | 1/1996 | Hurta | G01S 13/765 342/42 |
| 5,661,349 A | * | 8/1997 | Luck | A01G 25/16 307/130 |
| 8,127,162 B2 | * | 2/2012 | Satoh | G06F 1/3209 713/322 |
| 2010/0211809 A1 | * | 8/2010 | Shimada | G06F 1/3203 713/323 |

\* cited by examiner

*Primary Examiner* — Michael C Zarroli

(57) ABSTRACT

Eight Applications Specific Integrated Circuits (ASICs) for use in stand-alone end products and other devices requiring a 24 hour memory. They have a real-time clock as well as memory that stores On and Off Switch closures with the ability to repeat them. They also have power management to allow them to operate by receiving their power through the load they are switching. They also have LED drivers to indicate the function being performed. They can store a resolution of two minute or one minute intervals of On and Off Switch closures per 24 hour period depending upon the amount memory integrated into the ASIC. Only a few external components are required to create end products and/or utilize these ASICs in another product.

1 Claim, 13 Drawing Sheets

Fig. 1 (Diagram 1) of 13
Block Diagram of these Custom ASICS Inventions
24 Hour Programmable Timer ASICs
Inventor- Joseph Charles Conway
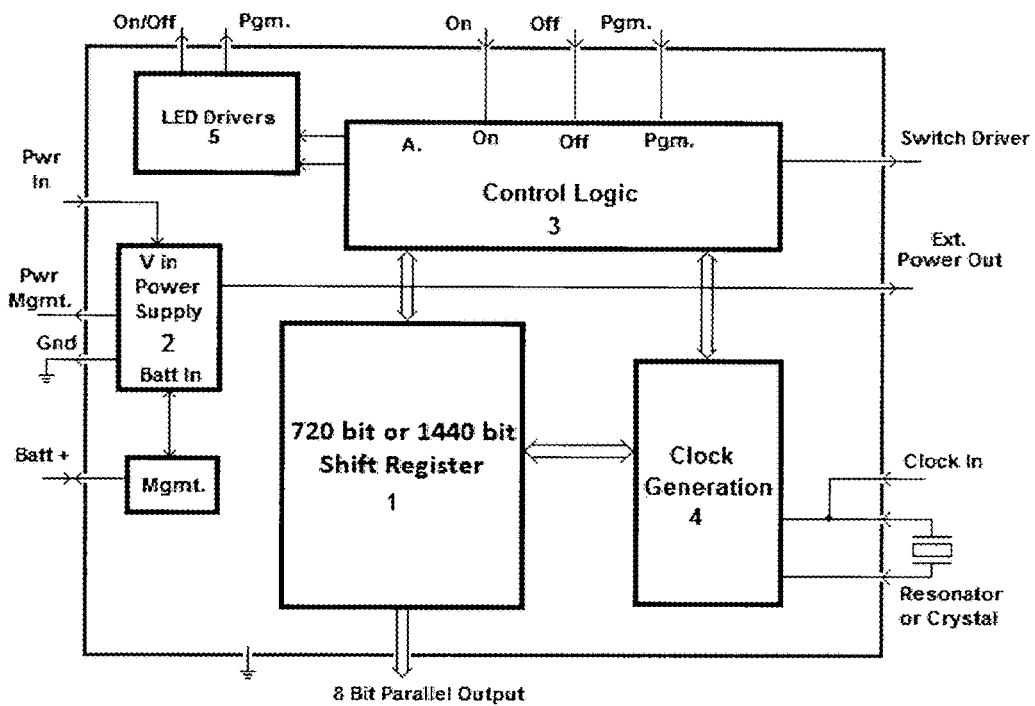

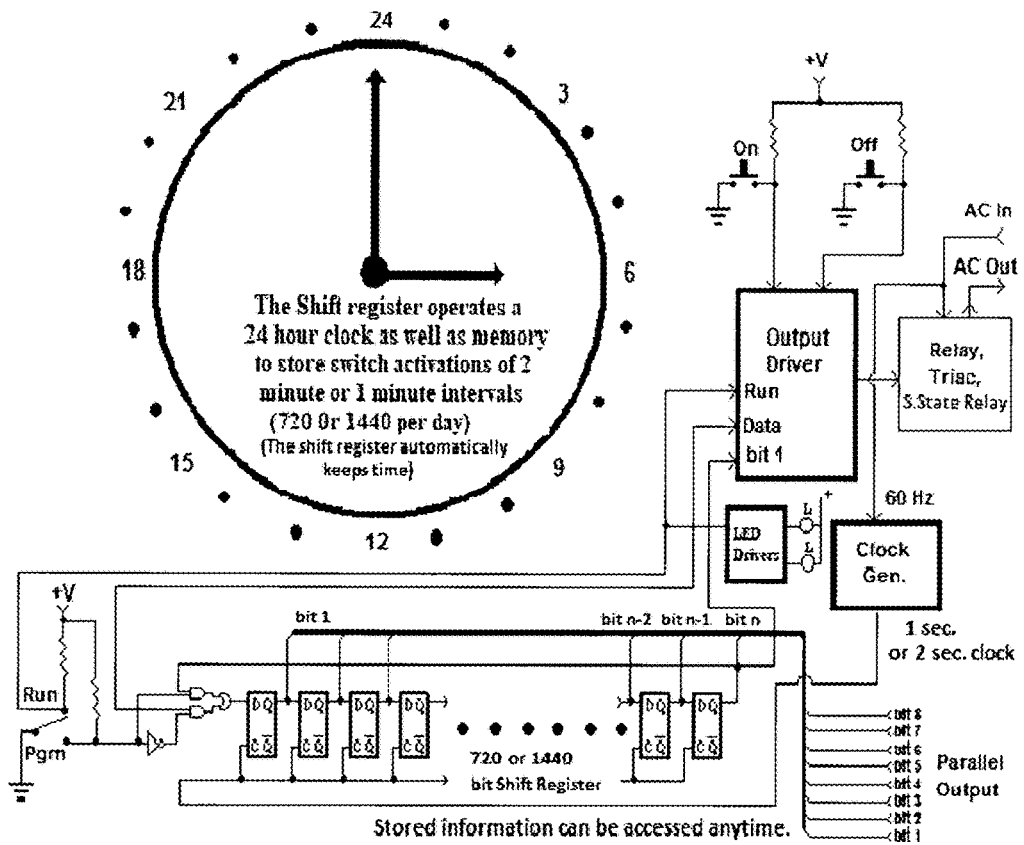
Fig. 2 (Diagram 2) of 13
Basic Application of these ASICs Inventions
24 Hour Programmable Timer ASICs
Inventor- Joseph Charles Conway

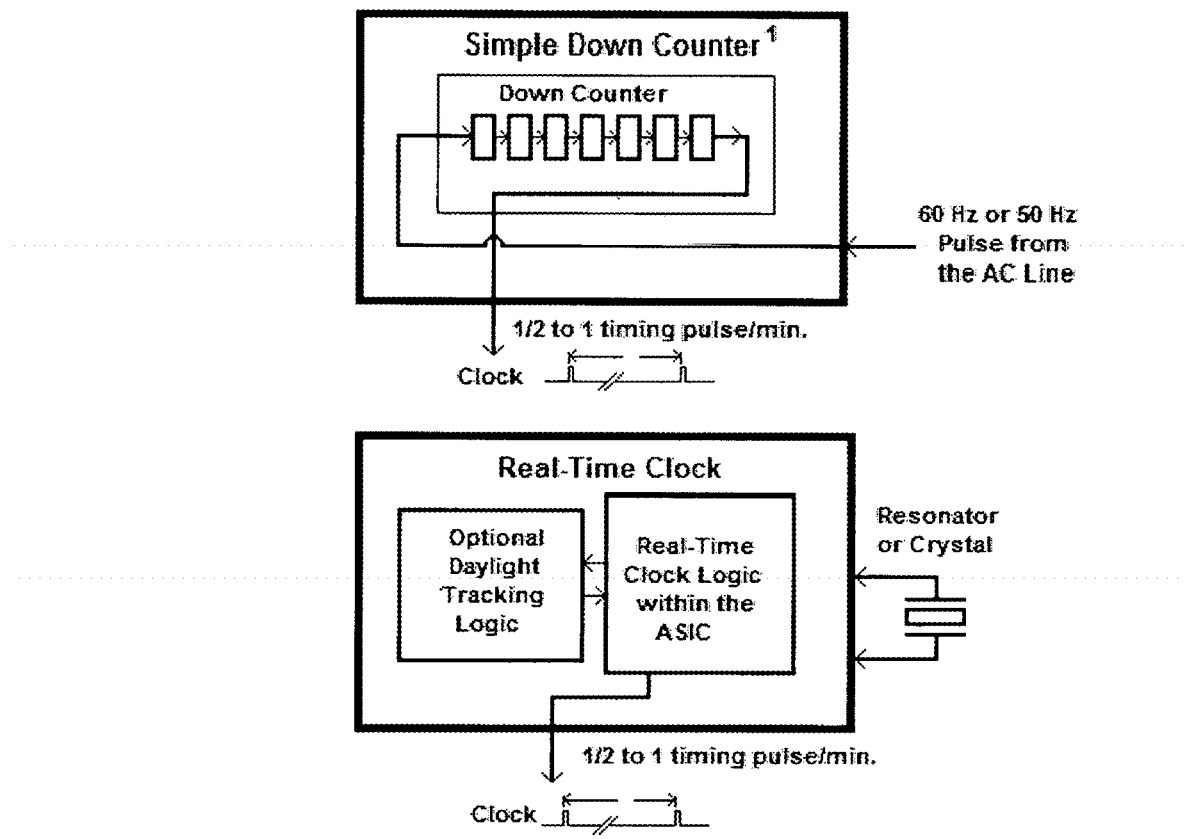

Fig. 4 (Diagram 4) of 13
Block Diagram - In Wall Mounted Unit
24 Hour Programmable Timer ASICs
Inventor- Joseph Charles Conway
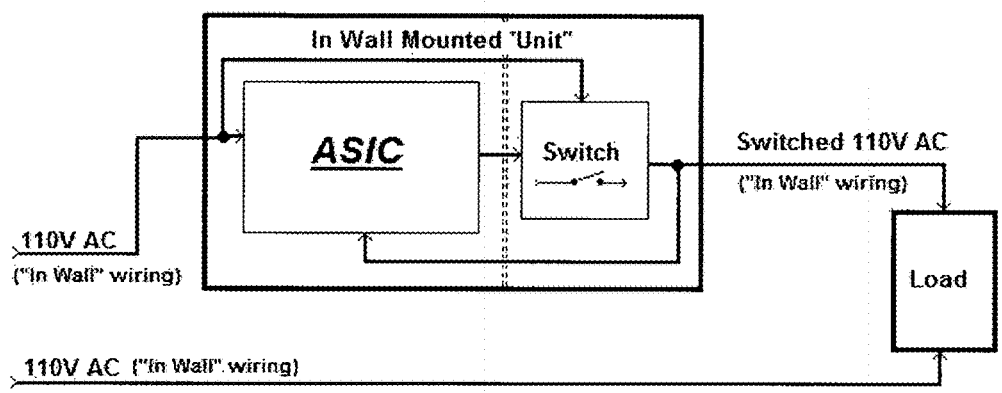

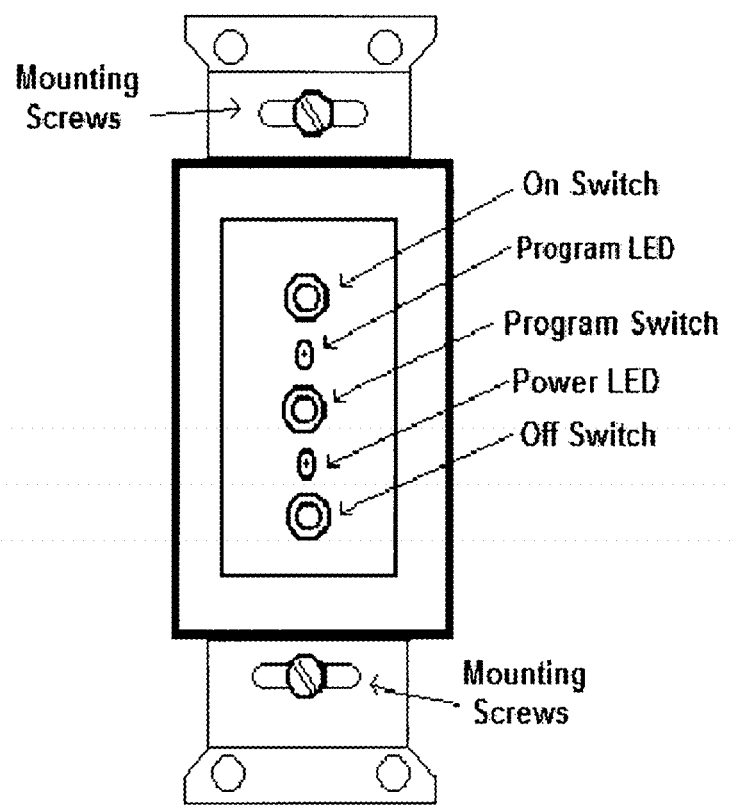
Fig. 5 (Diagram 5) of 13
Front View -Wall Mounted Unit
24 Hour Programmable Timer ASICs
Inventor- Joseph Charles Conway

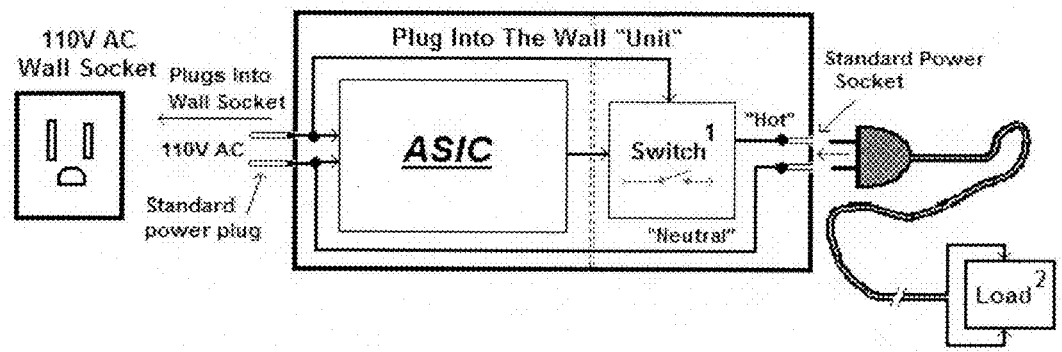
Fig. 6 (Diagram 6) of 13
Block Diagram - Plug Into The Wall Unit
24 Hour Programmable Timer ASICs
Inventor- Joseph Charles Conway

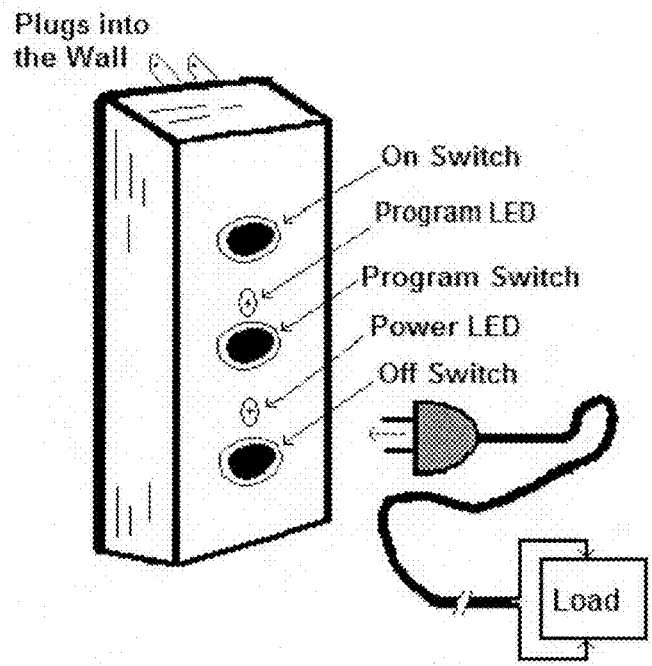
Fig. 7 (Diagram 7) of 13
Front View - Plug Into The Wall Unit
24 Hour Programmable Timer ASICs
Inventor- Joseph Charles Conway

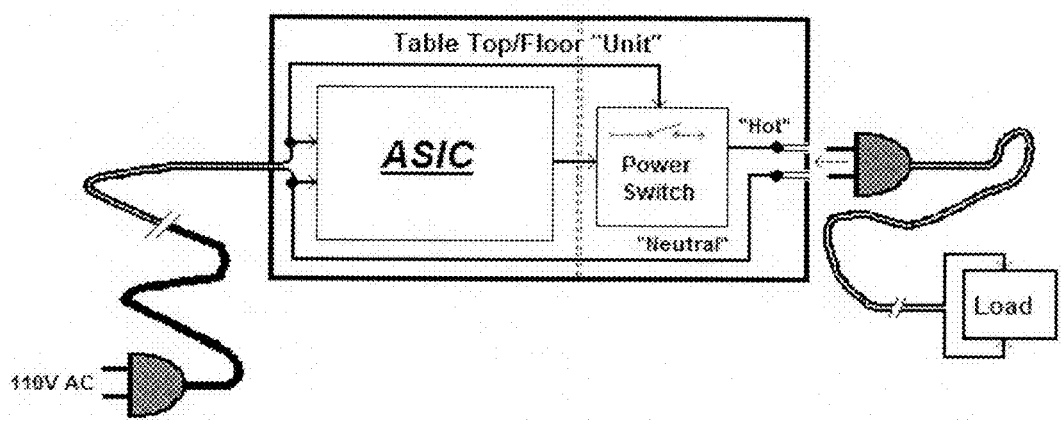
Fig. 8 (Diagram 8) of 13
Block Diagram - Table Top/Floor Unit
24 Hour Programmable Timer ASICs
Inventor- Joseph Charles Conway

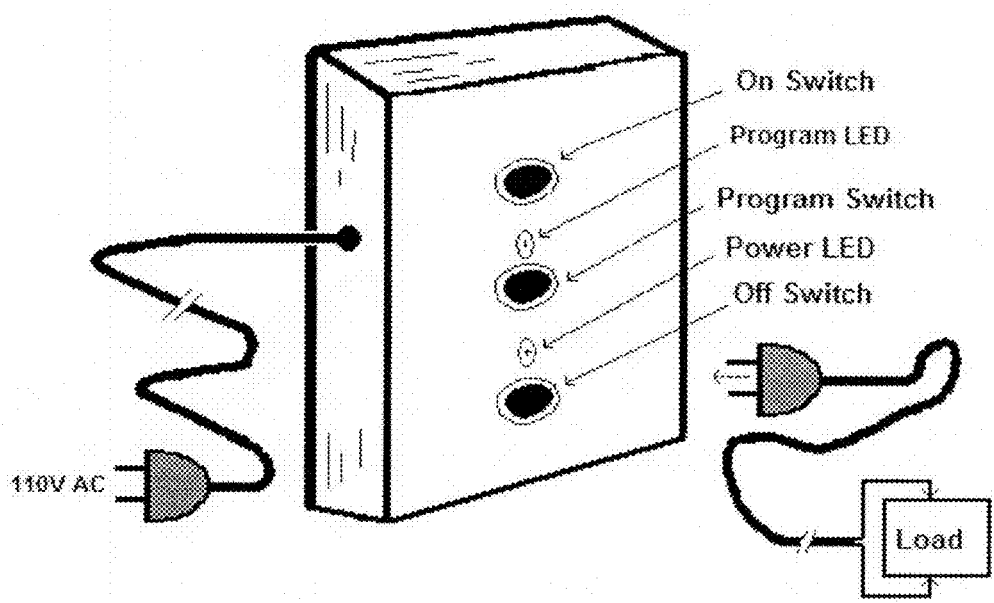

Fig. 10 (Diagram 10) of 13
Block Diagram - Inductive Load 110V Switching Unit
24 Hour Programmable Timer ASICs
Inventor- Joseph Charles Conway
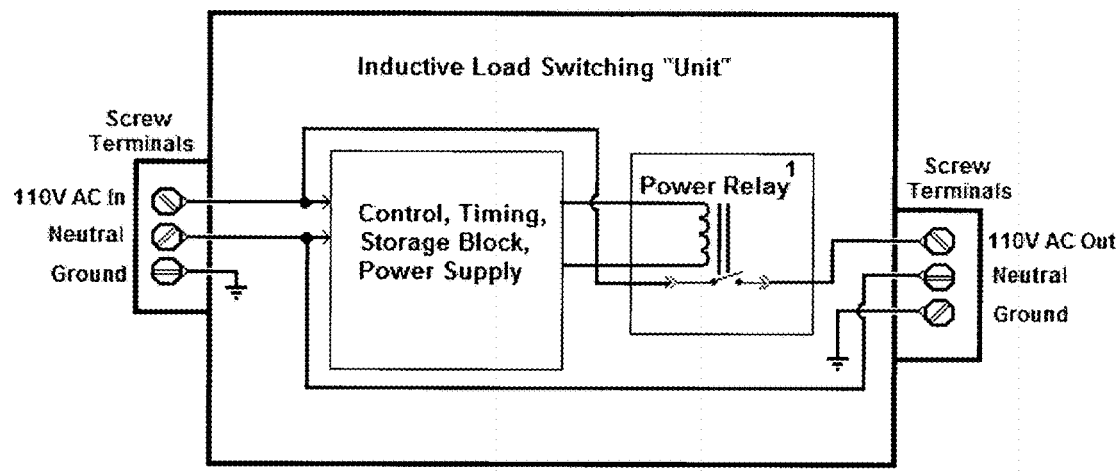
1. The Power Relay can be a Coil/Contact type or it can be a Solid State Relay.
   A Coil/Contact type of Relay is shown.

Fig. 11 (Diagram 11) of 13
Top View - Inductive Switching Unit
24 Hour Programmable Timer ASICs
Inventor- Joseph Charles Conway
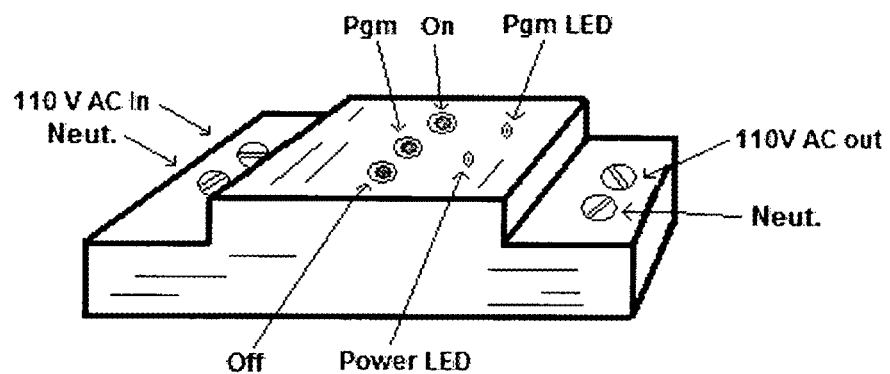

Fig. 12 (Diagram 12) of 13
Block Diagram - High Voltage Inductive Switching Unit
24 Hour Programmable Timer ASICs
Inventor- Joseph Charles Conway
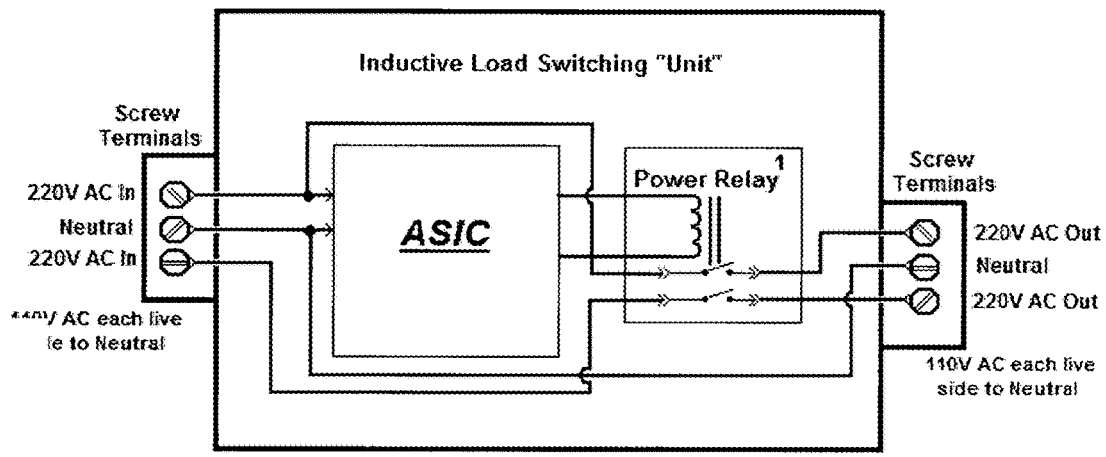
1. The Power Relay can be either Coil/Contact or Solid State.

Fig. 13 (Diagram 13) of 13
High Voltage Inductive Load Switching Unit
24 Hour Programmable Timer ASICs
Inventor- Joseph Charles Conway
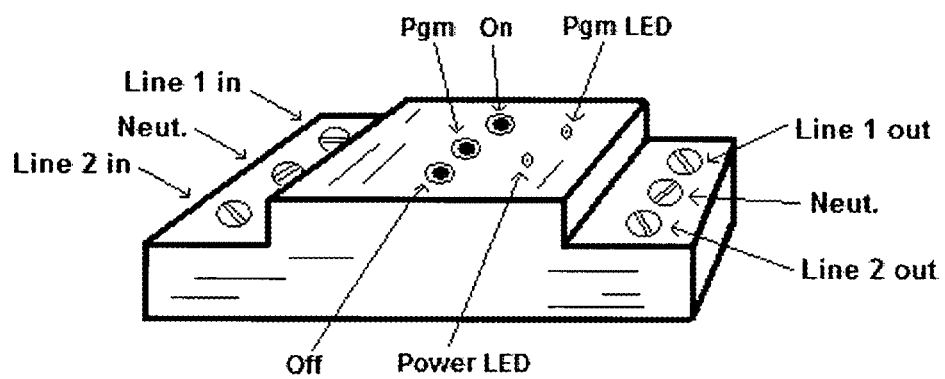

24 HOUR PROGRAMMABLE TIMER CUSTOM INTEGRATED CIRCUITS

DESCRIPTION OF INVENTION

This invention consists of the design of a number of Applications Specific Fully Integrated Applications Specific Custom Integrated Circuits hereafter referred to as ASICs providing fully integrated solution for memory oriented timer switch applications. When these ASICs are used to design end products, the only additional components needed are a few resistors, capacitors, high voltage transistors and an AC power switching device such as a Triac, Relay or Solid State Switch.

These ASICs utilize a shift register memory to record on and off activities for lighting and other devices for the previous 24 hour period then these ASICs can repeat them for each 24 hour period thereafter. These ASICs operate without the need for a computer or microprocessor. They are fully integrated and are organized to allow additional functionality to be easily added with a few external components.

These ASICs are very easy to interface to additional circuitry allowing many very useful additional functions. Only a few simple switches and components are needed to create an end product. End products that use these ASICs are very simple to use requiring no computers, smart phones or complex programming. They can be used for single phase I 10V standard home and office applications as well as the dual line power switching needed for 220V and 440V high-power applications. These ASICs utilize Semiconductor industry standard packaging or they can be directly mounted to the printed circuit board.

They were conceived to provide very simple to use fully custom integrated circuits as the main component that encompasses all the complex electronics needed. These ASICs directly lend themselves to home and office lighting and power switching, as well as 220V and 440V high-power home, office and industrial applications. These ASICs can also directly address 50 Hz international applications.

People throughout the world have been overwhelmed by the influx of difficult to use power switching products. These ASIC Inventions allow the design of end products providing a very easy to use Memory Oriented Switch Timer with no requirements for programming. Certain embodiments of this present invention include, but are not limited what is outlined.

TECHNICAL FIELD

Electronics—Integrated Circuit

This patent is for a family of Applications Specific Integrated Circuits that provide both the clocking requirements as well as the storage memory needed to record power switch usage for a 24 hour period and continuously repeat it upon request thereafter.

BACKGROUND ART

These ASICs represent an entirely different approach than the background art listed herein. These ASICs are extremely easy to use, do not use any computers or microprocessors, require no internal or external user programming, require no displays and can store up to the last 24 hours of previous switch activity and automatically repeat it when requested. With these ASICs no plurality of programming switches are needed, or any other kind of computer or cell phone interface. These ASICs control only a single switch circuit and do not inherently provide a dimming function. Being an Integrated Circuit these ASICs Invention have no combination locks or other mechanical needs.

Embodied in these ASICs Invention are resolutions of 720 or 1440 switch activations over a 24 hour period. The Shift Register size and Clocking within these ASICs can be changed to allow virtually any activation resolution to be realized within the capabilities of the Integrated Circuit technology utilized. These ASICs can easily be integrated into many other stand-alone products such as lamps, fans, pumps, heaters, air conditioners, and a wide range of other electrical devices.

The ASICs differences are displayed in Bold Text.

U.S. Pat. No. 5,160,853—Electronic Timer Switch with Time Tracker

Dated May 13, 1997—Tim Simon, Lee Tong

A programmable timer for turning a light on and off in response to changing sunset, daylight savings time, and other programmable conditions. The programmable timer includes an input device, a microprocessor, and an input device means for providing programming information. Said programming information includes geographical information comprising a graphical representation of a geographic area divided into a plurality of zones; a microprocessor for storing said Programming information, for computing an effective switching time responsive to said stored Programming information and for comparing said effective switching time to a current time to generate a timing control signal; and a switch, responsive to said timing control signal, for receiving input power from the power supply and for coupling said input power to the light.

This ASICs patent is for a family of single integrated circuits that provide most of the electronics required for end products offering memory power control. They can also be integrated into OEM products of other manufacturers.

These ASICs do not require a microprocessor, do not require geographical information divided into a plurality of zones, and have no requirement to compute an effective switching time responsive to said stored Programming Information and for comparing said effective switching time to a current time to generate a timing control signal; and a switch, responsive to said timing control signal.

U.S. Pat. No. 6,531,836—Automatic Light Switch

Mar. 11, 2003—Kevin Jones

This invention discloses a light switch designed physically similar to a present day conventional light switch having a face plate and on/off switching capability for connection to standard house current using 110/115 volts AC electricity.

The present invention discloses the light switch having memory capability wherein the light usage patterns actually used by the household resident can be stored into memory so that when the household residents are away from home they can activate the memory of the present invention so that the light switches are operated in their absence according to the actual usage pattern which has been exhibited by them while present in the house.

This patent comprises of a conventional light switch body with an on/off switch for turning said switch on and off, means for a computer disposed in said switch body, whereby the pattern of usage of the lighting system can be recorded, means for controlling said computer, means for electrical connection of the on/off switch, means for a computer, and means for controlling said computer. The means for a computer further comprises storage capacity for at least one week of operating data. It makes no specific claims on the device resolution or quantity of recorded changes that it is capable of.

This patent outlines an end product that provides the means for a computer with internal memory capability or microprocessor to be included within the device in order to realize the functionality desired. Its purpose is to record previous light switch activities and be able to repeat them. The product's form factor is also designed for direct installation into in-wall applications.

This ASICs patent is for a family of single integrated circuits that provide most of the electronics required for end products offering memory power control as well as integration into OEM products of other manufacturers. This Patent is not for a stand alone end product. These ASICs do not require a means for a computer disposed in said switch body, whereby the pattern of usage of the lighting system can be recorded.

These ASICs do not require a means for controlling said computer and the means for a computer that further comprises storage capacity for at least one week of operating data. These ASICs simply store their data directly in the shift register for the previous 24 hours that is also used as a real-time clock.

U.S. Pat. No. 5,629,587—Programmable Lighting Control System for Controlling illumination duration and intensity levels of lamps in multiple lighting strings May 13, 1997—Roger M. Gray, Barry C. Knockler A programmable lighting control system for advertising, decorative, artistic, and Christmas lighting applications, consisting of a standalone controller, an optional power booster device, and a personal computer compatible software program. The controller receives power via a standard AC outlet receptacle and includes: a plurality of AC output receptacles for connection to either series or parallel connected Christmas tree type lights or the like; a microcontroller to provide timing and control signals that are applied to solid state switching devices to drive the outlet receptacles; a non volatile memory to store custom user defined lighting sequences; a rotary, switch to enable the selection of either pre-programmed sequences or user defined sequences; and a serial communication port.

The personal computer compatible software program enables the user to create custom lighting sequences, which can be downloaded to the light controller non volatile memory via the serial port. The optional power booster device can be used to increase the output power capability of each of the individual controller output circuits. It is a lighting control device programmable by a user for the control of a plurality of lighting strings, each lighting string including a plurality of lamps, the device providing selection of individual lighting conditions of illumination duration and intensity level for each of the lamps.

The ASICs patent is for a family of single integrated circuits that provide most of the electronics required for end products offering memory power control. They can also be integrated into OEM products of other manufacturers. This Patent is not for a stand alone end product. These ASICs do not require an optional power booster device, They do not need a personal computer compatible software program, they do not have a plurality of AC output receptacles and do not require a non volatile memory to store custom user defined lighting sequences. These ASICs do not require a rotary, switch to enable the selection of either pre-programmed sequences or user defined sequences; and do not require a serial communication port.

These ASICs do not control a plurality of lighting strings, each lighting string including a plurality of lamps with the device providing selection of individual lighting conditions of illumination duration and intensity level for each of the lamps.

U.S. Pat. No. 4,344,000—Power Circuit Control Programmable Timer

Aug. 10, 1982—Louis W. Schornack, Richard Goldstein

This Timer patent is designed to be mounted over and behind a conventional wall switch cover plate and includes a two position timer condition-setting arm, a rotatable and depressible time setting dial knob and an indicator on the front of the cover plate. When the arm is moved to a timer-on position, the indicator flashes to indicate that timer programming is needed. This may be achieved in real time over the first twenty-four hours after a 30 minute play period by depressing the knob acting as an on and off power switch control push button to turn the light circuit on and off in a normal manner. Fast normal programming is achieved by rotating the knob to various time settings and depressing the knob to set ON or OFF markers in timer memory.

A full twenty-four hour programming is completed by either completing a full rotation of the knob over the full twenty-four hour time settings, with at least one ON and one OFF depression, or by a similar pair of knob depressions without such a full rotation, OFF markers then being automatically set by the timer to complete the timer programming.

The indicator comes steady-on to indicate that the timer is fully programmed and in an automatic mode of operation. The automatic operation is temporarily overridden by depression of the knob or permanently overridden by a simple distinctive speed or time duration depression of the knob.

It is a programmable timer comprising storage means having respective storage locations assigned to various time intervals over a twenty-four hour period and in which storage locations there can be manually stored turn-on or turn-off markers which are operable to control the condition of a given controlled means, the improvement comprising: manually operable time setting means operable to positions representing various time settings establishing initially a "present time" setting and then time settings defining the beginning of said various time intervals, manually operable marker signal generating means operable to ON and OFF marker signal generating conditions, manually operable timer condition setting means operable to timer de-energizing and timer-on conditions, means responsive to the initial setting of said manually operable time setting means to a "present time" setting and the subsequent operation of said manually operable marker signal generating means which generates a present time entering a signal for initiating a manual programming mode of operation of the timer, means subsequently responsive to the operation of said manually operable time setting to the various time settings and the operation of said marker signal generating means when said timer condition setting means is in said timer-on condition for entering or retaining ON and OFF markers in the storage locations corresponding to the time intervals identified by the time settings of said manually operable time setting means, and means responsive to the completion of the entry or retention of ON and OFF markers in all of the storage locations of said storage means for operating the timer in an automatic mode of operation where said storage locations are synchronously accessed and the markers in the accessed storage location control the condition of operation of said controlled means.

This patent discloses a programmable apparatus for providing random control of electrical devices such as appliances and is secured within the device by the use of a combination lock. It also locks the AC line cord into the device that is part of the circuit being controlled. The time or program can also be displayed. The apparatus also can be programmed to provide a look-ahead feature to address the need for connected devices to power-up early so that they warm up and are functional.

This ASICs patent is for a family of single integrated circuits that provide most of the electronics required for end products offering memory power control. They can also be integrated into OEM products of other manufacturers. This Patent is not for a stand alone end product.

These ASICs do not require a two position timer condition-setting arm, a rotatable and a depressible time setting dial knob. They do not flash an indicator to indicate programming is needed. These ASICs record any activity down to 1 minute or two minute intervals based upon use of the On and Off switches in the end products using them.

These ASICs do not need fast normal programming by rotating a knob to various time settings and depressing the knob.

These ASICs have no need for manually stored turn-on or turn-off markers to set ON or OFF markers in timer memory, instead, they simply use On and Off switches. They do not require entering or retaining ON and OFF markers in the storage locations corresponding to the time intervals identified by the time settings of said manually operable time setting means.

These ASICs exactly repeat the previous day's On and Off switch activity. They do not offer programming for an entire week with different programming for each day. These ASICs repeat the previous day's activity with a resolution of 1 to 2 minute intervals instead of small blocks of time, (for instance 30 minutes). These ASICS do not include a combination lock. These ASICs do not provide a look-ahead feature. These ASICs are simple and easy to use. This Power Circuit Control Programmable Timer is very complex and very difficult to use versus the ASICs.

U.S. Pat. No. 4,279,012—Programmable Appliance Controller

Sep. 23, 1978—David 1. Beckedorf, Michael Sporer, Bruce R. Watts

This Patent is a programmable apparatus for providing random on/off control of electrical devices such as appliances. Such control may be programmed for an entire week, with different programming for each day, and with programming control over small blocks of time, e.g. thirty minutes. Programming is secured by the use of a combination or lock and, in addition, the AC line cord of the electrical device, which receives or does not receive AC power depending upon the status of the program, is locked into the apparatus. During operation, the program in the apparatus may be interrogated and displayed; otherwise the time of day is displayed.

The apparatus also includes a look-ahead feature, turning on an appliance, such as a television set, earlier than programmed in order to provide sufficient warm-up time.

The means for entering comprises:

A. keyboard means having a plurality of keys, including a start key, a stop key and a plurality of data keys;

B. first means, responsive to the actuation of said start key followed by the actuation of some of said data keys, for storing said start time of one of said periods of time in said storage means; and C. second means, responsive to the actuation of said stop key followed by the actuation of some of said data keys, for storing said stop time of said one of said periods of time in said storage means, whereby said information indicative of said one of said periods of time is stored by means of said keyboard means.

D. said storage means includes a plurality of locations, each of said locations corresponding to a predetermined time interval, wherein the time between said start time and said stop time includes a plurality of said predetermined time intervals; and wherein said apparatus further comprises E. means for incrementing said current time of day by a predetermined amount of time thereby providing a look-ahead current time of day.

This ASICs patent is for a family of single integrated circuits that provide most of the electronics required for end products offering memory power control. They can also be integrated into OEM products of other manufacturers. This Patent is not for a stand alone end product. These ASICs do not provide "programming for an entire week, with different programming for each day, and with programming control over small blocks of time, e.g. thirty minutes."

These ASICs have no need to use the means for entering using a keyboard means having a plurality of keys, including a start key, a stop key and a plurality of data keys. These ASICs do not require the need to enter programming using a keyboard. These ASICs do not require that "programming is secured by the use of a combination or lock and, in addition, the AC line cord of the electrical device, which receives or does not receive AC power depending upon the status of the program, is locked into the apparatus." and "During operation, the program in the apparatus may be interrogated and displayed; otherwise the time of day is displayed." These ASICs simply repeat the previous day's On and Off activity. These ASICs do not include a look-ahead feature, turning on an appliance, such as a television set, earlier than programmed in order to provide sufficient warm-up time. Warm-up times are not supported for devices plugged into units controlled by these ASICs.

U.S. Pat. No. 9,320,122—Programmable Light Timer and a Method of Implementing a Programmable Light Timer Apr. 29, 2016—John Joseph King This patent is a programmable light timer for implementing a timing pattern. The programmable light timer comprises an actuator on a user interface of the programmable light timer enabling a selection of a time for the programmable light timer; a control circuit coupled to the actuator; a display coupled to the control circuit, wherein a time selected by the actuator is provided on the display; a first button on the user interface of the programmable light timer, wherein the first button is programmable to have an on time; and a second button on the user interface of the programmable light timer, wherein the second button is programmable to have an off time.

A method of implementing a timing pattern on a programmable light timer is also described.

It is a programmable light timer for implementing a timing pattern, the programmable light timer comprising: a. an actuator on a user interface of the programmable light timer enabling a selection of a time for the programmable light timer; b. a control circuit coupled to the actuator; c. wherein display coupled to the control circuit a time selected by the actuator is provided on the display; d. first button on the user interface of the programmable light timer, wherein the first button is programmable to have an on time; and a second button on the user interface of the programmable light timer, wherein the second button is programmable to have an off time.

The programmable light timer operates with the on time for the first button as a pre-stored on time, and the off time for the second button as a pre-stored off time. This programmable light timer comprises a third button that is programmable, by way of the actuator, with a user programmable on time. The third button can also have a pre-stored timing pattern.

These ASICs have no need for a display and do not have pre-stored timing patterns, These ASICs simply remember the previous day's On and Off activities. These ASICs do not require buttons to set On and Off times, they simply remember the previous day's On and Off activities by monitoring the On and off switches. The ASICs simply remember previous activity and have no need to have a display.

There is no need to use a programmable third button in combination with the actuator to set a user programmable on time.

U.S. Pat. No. 9,226,373—Programmable Light Timer and a Method of Implementing a Programmable Light Timer Dec. 29, 2015—John Joseph King A programmable light timer for implementing a timing pattern is described. The programmable light timer comprises a memory storing a plurality of timing patterns, each timing pattern being associated with a unique timing pattern code and having one or more on/off settings for a time period and a user interface enabling the selection of a timing pattern code, and the plurality of timing patterns. It is a programmable light timer for implementing a timing pattern, the programmable light timer comprising: a memory storing at least one timing pattern, the at least one timing pattern having one or more on/off settings for a time period; and a wireless communication circuit configured to receive, using a wireless communication protocol, at least one timing pattern selected on a user interface of a wireless device having a corresponding wireless communication circuit, the user interface enabling the selection of the at least one timing pattern; wherein the user interface is configured to receive a security code enabling the downloading of the timing pattern to the memory using the wireless communication protocol. This Programmable Light Timer works as follows: wherein the at least one timing pattern has at least a first set of on and off times for a first time period and a second set of on and off times for a second time period. The user interface enables the selection of dusk as an on time of the at least one timing pattern. The User Interface enables the selection of a first on time and a first off time for a first plurality of days of the week.

The user interface enables the selection of a second on time and a second off time for a second plurality of days of the week. The user interface enables an astronomic time for one of the on time or the off time.

The ASICs simply remember previous activity and do not require a user interface enabling a selection of a timing pattern. The ASICs do not require a wireless communication circuit in any manner configured to receive, using a wireless communication protocol, or at least one timing pattern selected on a user interface of a wireless device having a corresponding wireless communication circuit, the user interface enabling the selection of the at least one timing pattern. The ASICs do not require a user interface configured to receive a security code enabling the downloading of the timing pattern to the memory using the wireless communication protocol. The ASICs have no need to utilize a user interface to enable the selection of dusk as an on time of the at least one timing pattern. These ASICs do not require two buttons to set On and Off times, or manage a plurality of days of the week. Instead they simply remember the previous day's On and Off activities.

SUMMARY OF INVENTION

These ASIC's remember and automatically control Turn-on and Turn-off times for home, office and warehouse lighting and other power switching applications. They can be used in many additional applications by adding only a few external components. End products using them can be packaged in various form factors to address the intended use.

These ASICs fully integrate these functions:
A. Crystal Oscillator
B. Real-Time Clock
C. Timing Control
D. On and Off control
E. LED Drivers For Indicators
F. Shift Register Storage Memory (also part of the 24 hour clock)
G. Power Switch Driver
H. Power Management
I. Battery Management Technical Problem Basic power switches have been used to turn on and off electricity to lights, fans, appliances, pumps and anything else electrically powered since electricity was first invented. Then mechanical motor driven timers were first developed. Motor driven timers must be manually set with switches or moving tabs. More complex intelligent electronic timers subsequently arrived but they must be pre-programmed by the user before they can be operated. They must also be re-programmed if the power goes out unless they have battery back-up. Whenever any changes are needed they must be re-programmed again. Other even more complex devices arrived requiring the use of a cell phone or computer via Wi-Fi or other means of communication with the device for programming. Often a digital clock must also be set within these devices.

Programming and Re-programming is tedious, must be learned and it may be a long and complicated process. If any errors are made the unit may not work as planned or it will perform undesired operations. These programming errors may not be discovered until long after the desired operation was to occur.

Even the easier to use electronic versions of these programmable devices require an embedded microprocessor or complex internal electronics to control them. If the initial programming was not correctly entered they must also be re-programmed with the same uncertainty as the first time they were programmed. Cell Phone or Computer Programmed devices add yet an additional complication factor and are inherently difficult to learn and can be very frustrating to the user.

The ASICs Solution to the Problem

These Applications Specific Integrated Custom Circuits (ASICs) fully circumvent all of the shortcomings of currently available products. These ASICs were conceived to offer a very simple to learn and use solution for controlling lighting and other electrical devices while totally avoiding detailed instructions and complex programming requirements needed to setup complex devices. Products designed with these ASICs are extremely easy to use since no programming is needed. These ASICs are also extremely easy to integrate into stand-alone power control products as well as incorporation directly into OEM end products since they are highly integrated and require very few additional components to realize a functional product.

Advantageous Effects of Invention

These ASICs Provide the following key advantages to both manufacturers integrating these ASICs into their end products as well as the users of those manufactured products.

Advantages for Manufacturers

A. A highly integrated solution that requires the minimum of additional components to realize an end product or to integrate into existing products.
B. Elimination of the need for complex often confusing instructions for end products utilizing these ASICs.
C. Many similar end product uses for these ASICs.
D. Common design requirements for all the various end product uses for the ASICs.
E. The same or very similar switches, switch panels and other components for many variations of end products using these ASICs.

Advantages for End Customers of Products Utilizing these ASICs

A. Various end products that operate exactly the same. (IE, Wall Switches, Plug-in Units and table top versions.)
B. End products which are extremely easy to use.
C. No need to learn complex programming instructions.
D. No need to program products using these ASICs. This is accomplished by simply turning on and off power switches on products that use these ASICs.
E. Very low power consumption for end products using these ASICs.
F. Ability to simply "set and forget" devices powered by products using these ASICs.

DESCRIPTION OF DRAWINGS

Diagram 1.—Block Diagram of these Custom ASIC Inventions:

The block diagram Drawing 1.—shows the family of ASICs Invention and depicts the major internal components of these ASICs Invention. Each block is numbered and the following text outlines the functionality of each of these blocks.

1. The Shift Register (1)—720 bits or 1440 bits. This shift register functions as both a 24 hour clock and a two minute or one minute resolution memory to store switch activation information. This means that these ASICs Inventions are able to replicate the previous 24 hours of activity showing all "On" and "Off" sequences down to 2 minutes or 1 minute intervals depending on the shift register size placed in the ASICs.
2. Power Supply—This functional block manages external components to supply needed power to the device as well as supply power to other optional external circuitry. It also has a battery monitor/battery backup feature allowing rechargeable batteries to be used with the ASIC. The battery would be used to maintain data integrity if a loss of power occurs.
3. Control Logic—This block consists of several Flip Flops and a number of gates that process push button switch closures to turn on the external power switch and provide the switch activity information to the shift register for storage and later use.
4. Clock Generation—There are two basic ways the clock is generated within these ASICs Invention. The method of generation will depend upon what is desired within the ASICs Invention. See Diagram 3 for representative clock generation circuits.
5. LED Drivers—These are constant current sinking drivers that are used to power both the "Power" LED and the "Program" LED. These LED drivers are directly activated by digital signals created by the Control Logic.
6. Mgmt. (Battery Management) This Block provides the required sensing and charging circuitry needed to maintain and access power stored in a rechargeable battery if a battery is utilized in end products utilizing these ASICs.

INTERNAL BLOCK INTERACTION OF THE ASICS INVENTION

These ASICs are designed to be a fully integrated solution to provide the necessary electronic functions needed for the function desired.

Block 1, the 720 or 1440 bit Shift Register (shift register) is the main block of the ASICs and provides the equivalent of a 24 hour clock with the ability of remembering the previous 24 hours activity.

Block 2, Power Supply that also provides power to all the other blocks as well as providing external power for any desired additional external circuitry.

Block 3, Control Logic provides the electronic signals needed to control data storage or recirculation of Block 1, Shift Register as well as providing control inputs to the LED drivers.

Block 4, Clock Generation that is controlled by an external crystal or resonator. It can also operate from zero crossing pulses from the AC line. Its outputs go to Block 1, the Shift Register and Block 3, Control Logic providing clocking inputs.

Block 5, LED (light emitting diode) drivers provide a constant current for turning on and off the LEDs indicating the mode of operation.

Block 6 Mgmt. (Battery Management) provides the ability to draw power from the battery and providing it to Block 2, Power Supply or conversely taking power from Block 2, Power Supply to recharge the battery. It provides optimized battery charging as well as efficient battery power use.

Diagram 2. Basic Application of these ASICs:
Drawing 2. Depicts details of the basic application of these ASICs into an end product.
Diagram 3, Clock Generation Circuits:
Drawing 3. depicts two different variations of the Clock Generation that are designed into different versions of these ASICs. Certain embodiments of the present invention include, but are not limited to these methods of Clock Generation.

As shown in these drawings, different variations of Clock Generation will be used in these ASIC Inventions. The top diagram shows how simple down counters will be used to get the desired Shift Register clocking speeds. The bottom diagram shows the use of a Real-Time Clock as well as optional Daylight Tracking Logic.

The table (next page) shows the typical Clock and Shift Register values that can be used with the down counters. Certain embodiments of the present Invention include, but are not limited to these.

| AC Line Frequency | Resolution Desired | Shift Register Size | Number of Clocks Per Day | Resolution | Down Counter Length* |
|---|---|---|---|---|---|
| 60 Hz (N. America) | 2 Minutes | 720 | 720 | Every 2 Minutes | 1800 |
| 60 Hz (N. America) | 1 Minute | 1440 | 1440 | Every 1 Minute | 3600 |
| 50 Hz (International.) | 2 Minutes | 720 | 720 | Every 2 Minutes | 1500 |
| 50 Hz (International) | 1 Minute | 1440 | 1440 | Every 1 Minute | 3000 |

End Product Consumer Uses of these ASICs:
A. The functional Block Diagrams indicate how these ASICs can be integrated into consumer end products to address specific switching applications. Certain embodiments of these present ASICs include, but are not limited to these listed applications.
   Diagram 4 Shows a functional block diagram of an In Wall Mounted version of an End Product incorporating these ASICs Invention.
   Diagram 5 Shows a front view of what an In Wall Mounted version of an end product may possibly look like.
   This shows only one possible way the unit may be configured. Many other configurations are also possible.
   Diagram 6 Shows a functional block diagram of a Plug Into The Wall version of an End Product incorporating these ASICs Invention.
   Diagram 7 Shows a front view of what a Plug Into The Wall version of an end product may possibly look like. This shows only one possible way the unit may be configured. Many other configurations are also possible
   Diagram 8 Shows a functional block diagram of a Table Top or Floor version of an End Product incorporating these ASICs Invention.
   Diagram 9 Shows a front view of what a Table Top or Floor version of an end product may possibly look like. This shows only one possible way the unit may be configured. Many other configurations are also possible.
End Product Industrial Uses of these ASICs:
These ASICs can easily be integrated into industrial products used to switch 110, 220 or 440 volt loads. The ASICs provide the fully integrated timing functions. The external power switching device used with the ASICs only need to be chosen to support the voltage and current that needs to be switched. These ASICs have a fully integrated solution for all the other functionality needed. Certain embodiments of the present invention include, but are not limited to those shown herein.
   Diagram 10 Shows a functional block diagram of an Inductive 110 volt Switching Unit version of an end product incorporating these ASICs Invention that would control 110V AC large inductive loads. With the correct driver circuits these ASICs Inventions can operate both Mechanical Coil/Contact Relays as well as Solid State Relays.
   Diagram 11 Shows a front view of what an Inductive 110V Switching Unit version of an end product may possibly look like. This shows only one possible way the unit may be configured. Many other configurations are also possible and shows a unit designed to control 110V AC large inductive loads. With the correct driver circuits these ASICs Invention can operate both Mechanical Coil/Contact Relays as well as Solid State Relays.
   Diagram 12 Shows a functional block diagram of a High Voltage 220 volt or 440 volt Inductive Load Switching Unit incorporating these ASICs Invention.
   Diagram 13 Shows a front view of what a Inductive Load unit of an end product may possibly look like. This shows only one possible way the unit may be configured. Many other configurations are also possible.

The invention claimed is:
1. A group of eight highly integrated, low power Applications Specific Custom Integrated Circuits (ASICs);
   Four are specifically designed for use with 60 Hz AC line applications for geographical areas such as the USA, Canada and Mexico and four are designed for 50 Hz AC line applications for geographical areas such Europe and the British Isles; All eight of these ASICs integrate the following two key requirements into a single Applications Specific Integrated Circuit (ASIC);
   A) All eight ASICs obtain their operating power by drawing it through any low power commercially available LED lamp or other low power device that they are controlling, with a minimum 4 Watt power rating, without lighting the LED lamp or activating the other low power devices in any manner, and these ASICs derive their power by drawing a small amount of current through the load they are going to switch before actually switching the load;
   B) All eight ASICs directly remember the activity of two low-power On and Off switches that turn on, or off AC power to an AC load that they are controlling, the On\Off switch activations are automatically recorded if a Program/Run Switch is set to Program; if the Program/Run Switch input is set to Run any previously recorded ON\Off Switch Activations from the last 24 hours are then repeated at 24 hour intervals until the Program/Run switch is again set to Program;
   C) All eight ASICs have most all of the power supply components needed for power control and all the required digital logic integrated into a single ASIC that requires less than 3 milliamps of current at 3.3 volts to 1.5 volts, The Power Supply and Management sections of each ASIC provide this;
   D) All eight ASICs fully integrate a combination of digital counters and an internal 24 hour timer for 2 minute resolution for 720 bits of internal memory or 1 minute Resolution for 1440 bits of internal memory; finer resolutions can be obtained if additional memory is integrated into these ASICs;
      a) Two of the eight ASICs that operate at 60 Hz and two of the eight ASICs that operate at 50 Hz and do not include a daylight tracking timer that calculates available Daylight throughout the year;
      b) Two of the eight ASICs that operate at 60 Hz and two of the eight ASICs that operate at 50 Hz and include a daylight tracking timer that calculates available Daylight throughout the year.

* * * * *